(12) United States Patent
Park et al.

(10) Patent No.: US 7,349,256 B2
(45) Date of Patent: Mar. 25, 2008

(54) FLASH MEMORY DEVICES AND METHODS OF PROGRAMMING THE SAME BY OVERLAPPING PROGRAMMING OPERATIONS FOR MULTIPLE MATS

(75) Inventors: Jin-Sung Park, Gyeonggi-do (KR); Dae-Seok Byeon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 34 days.

(21) Appl. No.: 11/283,646

(22) Filed: Nov. 21, 2005

(65) Prior Publication Data

US 2006/0133145 A1  Jun. 22, 2006

(30) Foreign Application Priority Data

Dec. 21, 2004  (KR) .................. 10-2004-0109827

(51) Int. Cl.
*G11C 16/04*  (2006.01)
*G11C 11/34*  (2006.01)
*G11C 7/00*  (2006.01)

(52) U.S. Cl. .................. 365/185.11; 365/185.12; 365/185.29; 365/185.33; 365/220

(58) Field of Classification Search .......... 365/185.11, 365/185.12, 185.29, 185.33, 220
See application file for complete search history.

(56) References Cited

U.S. PATENT DOCUMENTS

2003/0016562 A1* 1/2003 Im .................. 365/189.02
2003/0076719 A1* 4/2003 Byeon et al. ........... 365/200
2004/0174727 A1* 9/2004 Park .................. 365/100
2005/0172086 A1* 8/2005 Kawai ................ 711/154
2005/0259466 A1* 11/2005 Kim .................. 365/185.05

FOREIGN PATENT DOCUMENTS

| JP | 2000-285686 | 10/2000 |
| JP | 2003-115192 | 4/2003 |
| KR | 10-1998-047903 | 9/1998 |
| KR | 10-1999-013059 | 2/1999 |
| KR | 10-2001-0029594 | 4/2001 |
| KR | 10-2001-0102826 | 11/2001 |
| KR | 1020030054076 A | 7/2003 |
| KR | 2006020299 A * | 3/2006 |

OTHER PUBLICATIONS

Notice to File a Response/Amendment to the Examination Report for Korean Patent Application No. 10-2004-0109827 mailed on Apr. 12, 2006.

* cited by examiner

*Primary Examiner*—Ly Duy Pham
(74) *Attorney, Agent, or Firm*—Myers Bigel Sibley & Sajovec, PA

(57) ABSTRACT

A flash memory device is programmed by loading first data into a page buffer of a first mat. Second data is loaded into a page buffer of a second mat while programming the first data in a first memory block of the first mat.

8 Claims, 3 Drawing Sheets

FLASH MEMORY DEVICES AND METHODS OF PROGRAMMING THE SAME BY OVERLAPPING PROGRAMMING OPERATIONS FOR MULTIPLE MATS

CROSS-REFERENCE TO RELATED APPLICATION

This application claims the benefit of and priority to Korean Patent Application No. 2004-109827, filed Dec. 21, 2004, the disclosure of which is hereby incorporated herein by reference.

BACKGROUND OF THE INVENTION

The present invention relates generally to semiconductor memory devices, and, more particularly, to NAND flash memory devices and methods of programming the same.

Semiconductor memory devices may be used to store data and read data therefrom. Semiconductor memory devices may be classified into Random Access Memory (RAM) and Read Only Memory (ROM). In RAM devices, the data stored therein is lost when power is turned off. RAM devices include DRAM (Dynamic RAM) and SRAM (Static RAM). ROM devices include PROM (Programmable ROM), EPROM (Erasable PROM), EEPROM (Electrically EPROM), and Flash Memory Devices. Flash memory devices may be classified into two groups: One is a NAND-type flash memory device and the other is a NOR-type flash memory device.

The NAND-type flash memory device includes a word line and a bit line, which are arranged in a matrix format. Memory cells are connected to the word line and the bit line. The word line is selected by a row address, and a bit line is selected by a column address.

The NAND-type flash memory device comprises a large number of memory cells with a string structure. These memory cells are called a "cell array." A memory cell has a floating gate and a control gate. Electrical erase and program operations are performed by injecting and emitting electric charges to the floating gate. A memory cell in which electric charges are injected in the floating gate is called a "programmed cell," and a memory cell in which electric charges are emitted from the floating gate is called an "erased cell."

In a NAND-type flash memory device, the cell array is divided into a plurality of blocks. Each of the blocks comprises a plurality of pages. Each of the pages comprises a plurality of memory cells sharing one word line. The NAND-type flash memory device performs read and write operations by a page unit and performs an erase operation by a block unit.

A NAND-type flash memory device includes a page buffer for temporarily storing data to be stored in the cell array. A mat typically includes one page buffer. One page buffer is typically 2 Kbyte. In this regard, a mat typically includes one cell array and a set of one page buffer.

A conventional programming method for a NAND-type flash memory device includes the following operations: A loading command, an address, and data with respect to the first mat are sequentially input through an I/O line to the NAND-type flash memory device. After data to be programmed, that is, data less than one page quantity is input, the data input to the page buffer is programmed to a cell array of the first mat by a program command at the same time. Next, a program operation with respect to a second mat is performed in the same manner as the program operation with respect to the first mat.

In the conventional programming method of a NAND-type flash memory device, after the program operation with respect to the first mat is completed, an operation for loading data to be programmed in the second mat into the page buffer is performed. According to the conventional program method, it may take a long time to perform the program operation for a plurality of mats.

To reduce a programming time, a NAND-type flash memory device may include a page buffer as well as a cache memory. While a programming operation is performed from the page buffer to the cell array, the cache memory reduces a program time by loading data to be programmed next into the page buffer. However, due to the cache memory, area used for the NAND-type flash memory is increased.

SUMMARY OF THE INVENTION

According to some embodiments of the present invention, a flash memory device is programmed by loading first data into a page buffer of a first mat. Second data is loaded into a page buffer of a second mat while programming the first data in a first memory block of the first mat.

In other embodiments, the second data is programmed in the second memory block of the second mat.

In still other embodiments, the first and second memory blocks are erased simultaneously.

In still other embodiments, a ready/busy signal for the flash memory device transitions to a busy state. Then, an address of the second memory block is received in synchronization with transitions of a write enable signal. The second data is loaded into the page buffer of the second mat in synchronization with transitions of the write enable signal.

In still other embodiments, an address of the first memory block and an address of the second memory block are the same.

In still other embodiments, loading the first data comprises receiving an address of the first memory block in synchronization with transitions of a write enable signal. The first data is loaded into the page buffer of the first mat in synchronization with transitions of the write enable signal.

In further embodiments of the present invention, a flash memory device is programmed by loading first data into a page buffer of a first mat. Second data is loaded into a page buffer of a second mat. At least some of the first and second data are programmed into first and second memory blocks of the first and second mats, respectively, concurrently.

In still further embodiments, loading the first data comprises receiving an address of the first memory block in synchronization with transitions of a write enable signal, and loading the first data into the page buffer of the first mat in synchronization with transitions of the write enable signal.

In still further embodiments, loading the second data comprises transitioning a ready/busy signal for the flash memory device to a busy state and then to a ready state. An address of the second memory block is then received in synchronization with transitions of a write enable signal. The second data is loaded into the page buffer of the second mat in synchronization with transitions of the write enable signal.

Although described above primarily with respect to method embodiments of the present invention, it will be understood that the present invention may also be embodied as flash memory devices.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
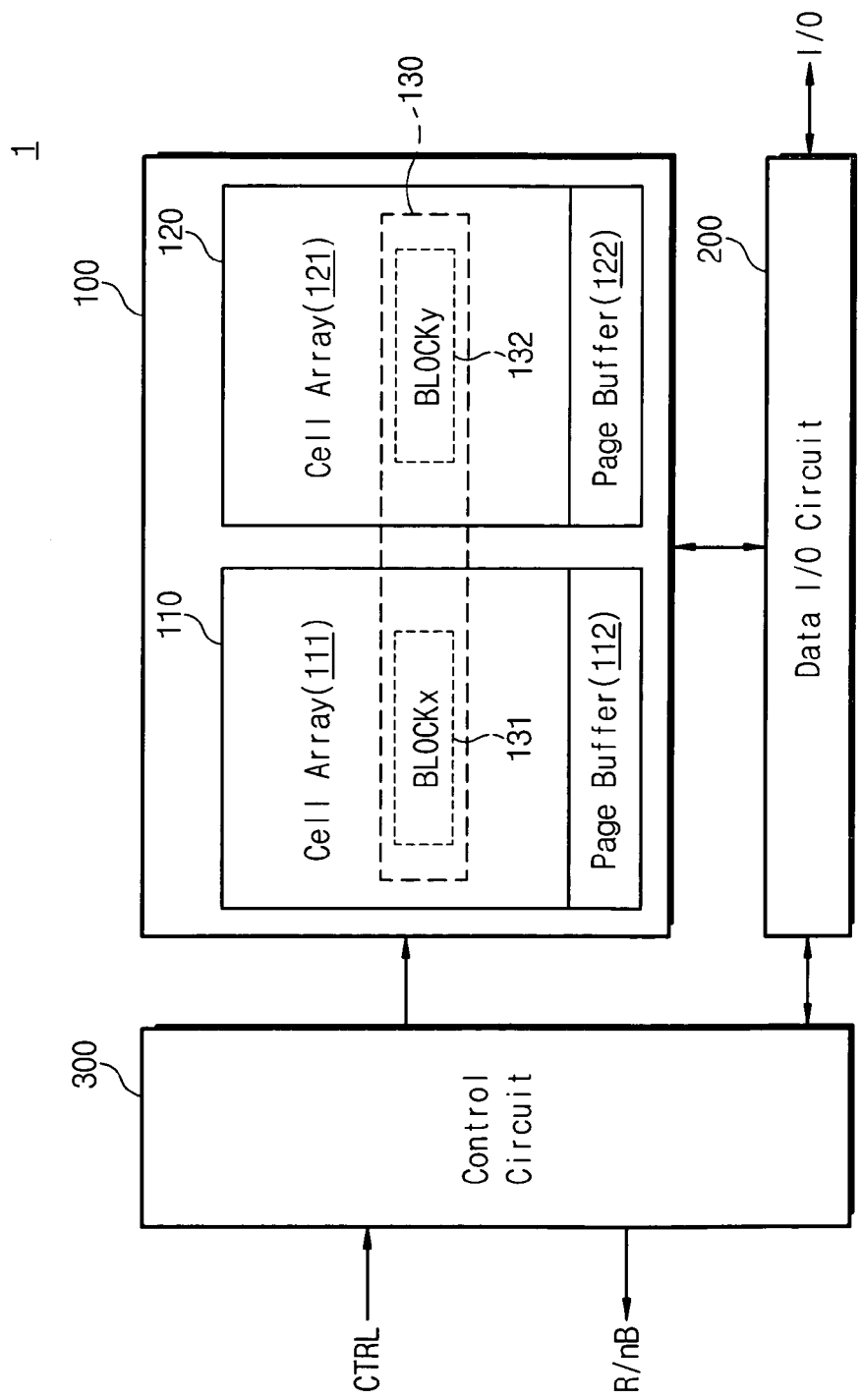
FIG. 1 is a block diagram that illustrates a NAND flash memory device according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram that illustrates a NAND flash memory device according to some embodiments of the present invention. Referring to FIG. 1, the NAND flash memory device 1 comprises a memory core 100, a data input/output circuit 200, and a control circuit 300.

The memory core 100 comprises a first mat 110 and a second mat 120; however, it will be understood that the memory core may comprise additional mats.

The first mat 110 comprises a cell array 111 and a page buffer 112. The memory cell array 111 comprises a plurality of memory blocks. In FIG. 1, memory block BLOCKx (131) is one of the plurality of memory blocks. Each of the memory blocks is a unit of an erase operation in the NAND flash memory device. Each of the memory blocks comprises a plurality of pages. Each of pages is a unit of a reading and/or writing operation.

The page buffer temporarily stores data that is to be written in a page or read from the page. The data stored in the page buffer 112 is programmed in the page by a program operation at the same time.

The second mat 120 has the same structure as the first mat 110 and also performs the same function.

The memory block BLOCKx (131) of the first mat 110 and a memory block BLOCKy (132) of the second mat 120 comprise one logical memory block 130. The logical memory block has the same address except for a mat division address. The entire logical memory block is erased during an erase operation at the same time. In other words, the memory block BLOCKx 131 of the first mat 110 is treated the same as the memory block BLOCKy 132 of the second mat 120.

The data I/O circuit 200 receives a command, an address, and data through an I/O line. The data input to the data I/O circuit 200 is loaded through a data line to page buffers 112 and 122.

The control circuit 300 controls the memory core 100 and the data I/O circuit 200 in response to a control signal CTRL. For instance, when data is input, the control circuit 300 provides a write enable signal nWE to the data I/O circuit 200. The data I/O circuit 200 loads data into the page buffer 112 in synchronization with the write enable signal nWe. The control circuit 300 programs the data loaded into the page buffer 112 to the memory block 131 by controlling the memory core 100. In this case, the control circuit 300 sends a ready/busy signal R/nB to a host (not shown) and then indicates that the NAND flash memory device 1 is in a busy state. When the NAND flash memory device 1 is in a busy state, a program operation is performed in the first mat 110.

Figure 2:
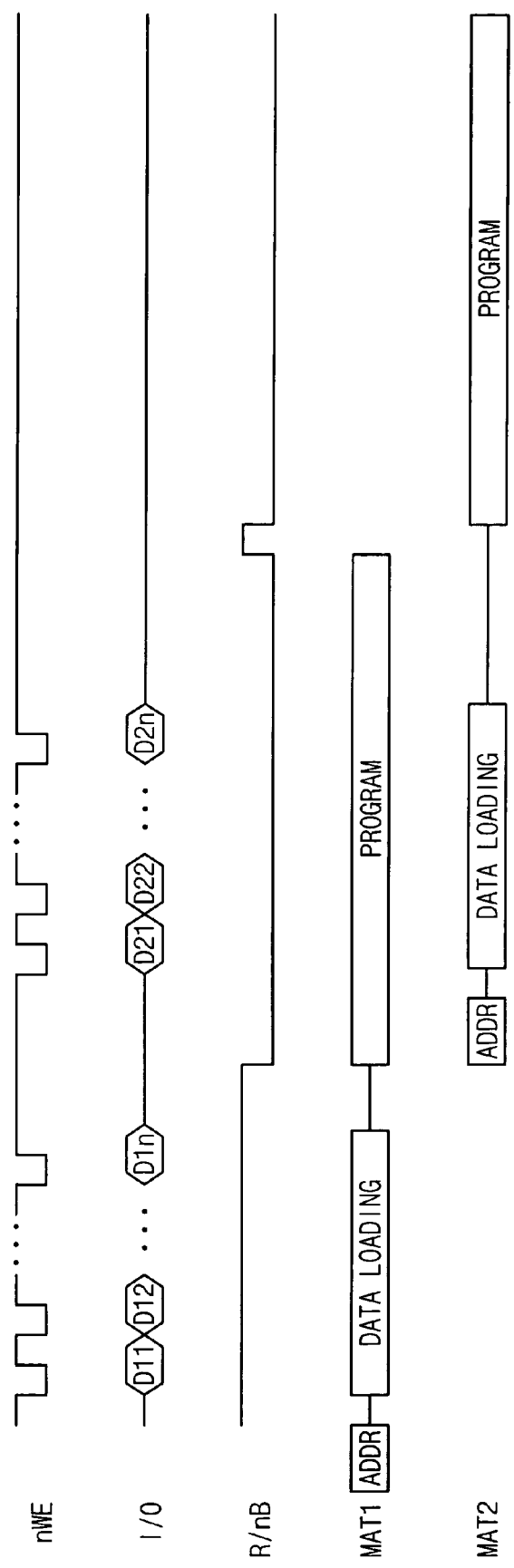
FIG. 2 is a timing diagram that illustrates a programming method of a NAND flash memory device according to some embodiments of the present invention.

FIG. 2 is a timing diagram that illustrates a programming method of a NAND flash memory device according to some embodiments of the present invention. According to this method, a program operation is performed by using a page buffers that exist in different mats without cache memory.

Referring to FIG. 2, data is input through the I/O line by a byte unit in synchronization with a transition of a write enable signal nWe. Programming methods of the NAND flash memory device, in accordance with some embodiments of the present invention, will be described with reference to FIGS. 1 and 2.

A data loading command is input to the NAND flash memory device in synchronization with the write enable signal nWe. And, an address of the first mat 110 is input in synchronization with a transition of the write enable signal nWe.

Next, data D11~D1$n$ corresponding to one page (e.g., 2 Kbyte) is loaded into the page buffer 112 of the first mat 110 in synchronization with the transition of the write enable signal nWe.

After all data D11~D1$n$ are loaded into the page buffer 112 of the first mat 110, an operation for programming the data loaded into the page buffer 112 to a cell array 111 is performed. In this case, a monitoring signal indicating that the first mat 110 enters into a program operation state enters a low state. In other words, a ready/busy signal enters a busy state. In a conventional NAND flash memory device, after the ready/busy signal enters the ready state, a next programming operation is performed. In some embodiments of the present invention, when the NAND flash memory device is in a busy state, an address of the second mat 120 is input in synchronization with the write enable signal nWe. After receiving the address of the second mat 120, data D21~D2n are loaded into the page buffer 122 of the second mat 120 in synchronization with the write enable signal nWe while the ready/busy signal R/nB a busy state is in a busy state.

Then, after all data D21~D2n are loaded into the page buffer 122 of the second mat 120, an operation for programming the data loaded into the page buffer 122 to the cell array 121 is performed. At this time, a ready/busy signal R/nB a busy state.

In the above-described programming method for a NAND flash memory device, according to some embodiments of the present invention, the same address, except for a mat address, is input to the first and second mats 110 and 120. That is, the same address of the memory blocks 131 and 132 is input to the first and second mats 110 and 120. Logical memory blocks 130 of the first mat and second mat 110 and 120 are erased at the same time.

Also, while a program operation is performed in the first mat, data is loaded into the page buffer of the second mat. Accordingly, some benefits of an additional cache memory may be provided. Moreover, it may be possible to reduce a programming time by reducing a time for loading data into the page buffer.

Figure 3:
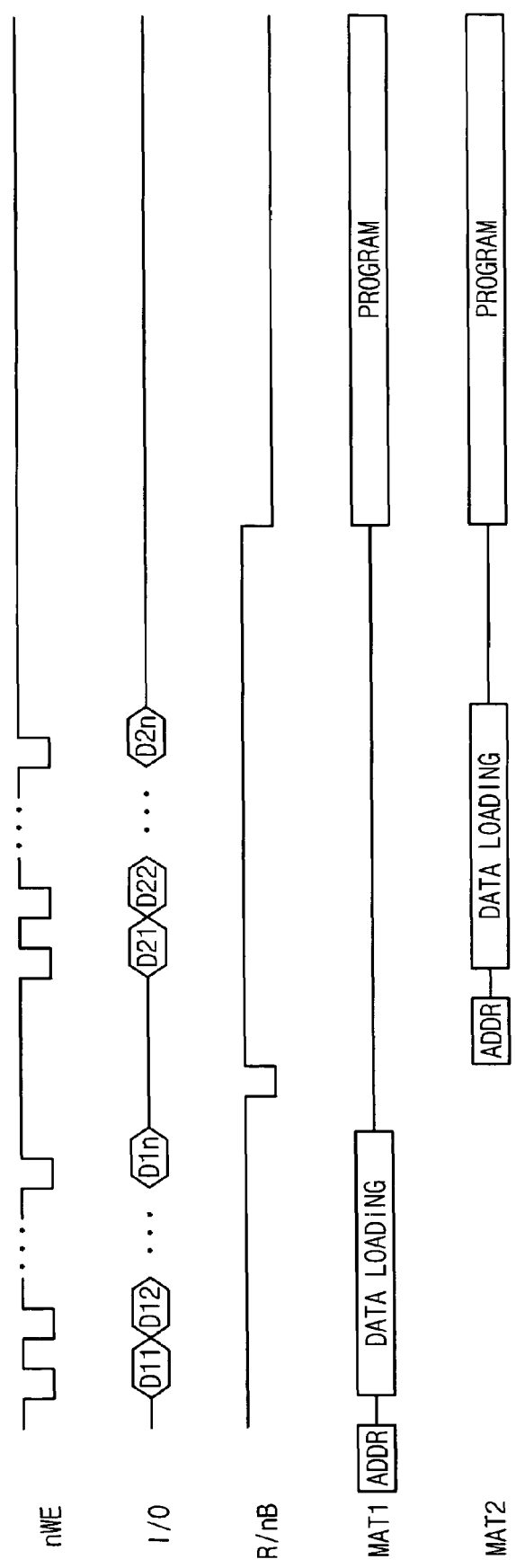
FIG. 3 is a timing diagram that illustrates a programming method for a NAND flash memory device according to further embodiments of the present invention.

FIG. 3 is a timing diagram that illustrates a programming method for a NAND flash memory device according to further embodiments of the present invention. After inputting an address and first data in the first mat 110, an address and second data are input to the second mat 120. A program operation is performed with respect to the first and second mats 110 and 120 for at least some of the first and second data concurrently, thereby reducing a program time.

A programming method for a NAND flash memory device according to some embodiments of the present invention will be described with reference to FIGS. 1 and 3.

A data loading command is input to the NAND flash memory device 1 in synchronization with a transition of a write enable signal nWe. An address of the first mat 110 is input in synchronization with a transition of the write enable signal nWE.

Next, data D11~D1n comprising one page (e.g., 2 Kbyte) is loaded into the page buffer 112 of the first mat 110 in synchronization with the transition of the write enable signal nWe.

After all of the data D11~D1n are loaded into the page buffer 112 of the first mat 110, a ready/busy R/nB signal enters a busy state. In this case, the busy state of the ready/busy R/nB signal does not indicate that the first mat 110 enters into a program operation mode. In other words, a program operation is not performed in the first mat during the busy state. This busy state is defined as a "dummy busy state."

When the ready/busy R/nB signal is in a ready state after a dummy busy state, the address of the second mat 120 is input in synchronization with the write enable signal nWE. In addition, the data D21~D2n are loaded into the page buffer of the second mat 120 in synchronization with the write enable signal nWE.

After all data D21~D2n are loaded into the page buffer 122 of the second mat 120, the data loaded into the page buffers 112 and 122 of the first and second mats 110 and 120 are simultaneously programmed to the cell arrays 111 and 121 of the first and second mats 110 and 120. At this time, the ready/busy R/nB signal enters a busy state.

In a programming method of a NAND flash memory device according to further embodiments of the present invention, the same address, except for an address dividing mats, is input to the first and second mats 110 and 120. That is, the same address of the memory blocks 131 and 132 is input to the first and second mats 110 and 120. The logical memory blocks 130 of the first and second mats 110 and 120 are erased simultaneously during an erase operation.

In addition, after loading all data into the page buffers of the first and second mats, a program operation is performed with respect to the first and second mats. Therefore, it is possible to reduce a time for programming the data loaded into the page buffer.

As discussed above, programming methods of NAND flash memory devices, according to some embodiments of the present invention, may reduce programming time by using a page buffer assigned to different mats. In addition, area used for a NAND flash memory device can be reduced because a cache memory is not used.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of programming a flash memory device comprising:
    loading first data into a page buffer of a first mat;
    loading second data into a page buffer of a second mat while programming the first data at a first address of a first memory block of the first mat; and
    programming the second data at a second address of a second memory block of the second mat;
    wherein the first address of a first memory block and the second address of the second memory block are the same.

2. The method of claim 1, further comprising:
    erasing the first and second memory blocks simultaneously.

3. The method of claim 1, wherein loading the second data comprises:
    transitioning a ready/busy signal for the flash memory device to a busy state; then
    receiving an address of the second memory block in synchronization with transitions of a write enable signal; and
    loading the second data into the page buffer of the second mat in synchronization with transitions of the write enable signal.

4. The method of claim 1, wherein loading the first data comprises:
    receiving an address of the first memory block in synchronization with transitions of a write enable signal; and
    loading the first data into the page buffer of the first mat in synchronization with transitions of the write enable signal.

5. A flash memory device comprising:
    a first mat that comprises a first memory block and a first page buffer that is configured to receive first data; and
    a second mat that comprises a second page buffer that is configured to receive second data while the first data is programmed at a first address of the first memory block and a second memory block that is configured to be programmed with the second data at a second address;

wherein the first address of the first memory block and the second address of the second memory block are the same.

6. The device of claim 5, wherein the first and second memory blocks are configured to be erased simultaneously.

7. The device of claim 5, wherein the second mat is further configured to receive an address of the second memory block in synchronization with transitions of a write enable signal and to load the second data into the second page buffer in synchronization with transitions of the write enable signal responsive to a transition of a ready/busy signal for the flash memory device to a busy state.

8. The device of claim 5, wherein the first mat is further configured to receive an address of the first memory block in synchronization with transitions of a write enable signal, and to load the first data into the first page buffer in synchronization with transitions of the write enable signal.

* * * * *

UNITED STATES PATENT AND TRADEMARK OFFICE
CERTIFICATE OF CORRECTION

PATENT NO. : 7,349,256 B2  Page 1 of 1
APPLICATION NO. : 11/283646
DATED : March 25, 2008
INVENTOR(S) : Park et al.

It is certified that error appears in the above-identified patent and that said Letters Patent is hereby corrected as shown below:

Column 6, Claim 3, Line 45:    Please correct "receiving an"
                                To read -- receiving the second --

Column 6, Claim 4, Line 53:    Please correct "receiving an"
                                To read -- receiving the first --

Column 7, Claim 7, Line 7:     Please correct "receive an"
                                To read -- receive the second --

Column 8, Claim 8, Line 4:     Please correct "receive an"
                                To read -- receive the first --

Signed and Sealed this

Twenty-fourth Day of June, 2008

JON W. DUDAS
*Director of the United States Patent and Trademark Office*